(12) United States Patent
Leussler

(10) Patent No.: US 8,013,606 B2
(45) Date of Patent: Sep. 6, 2011

(54) SHIELDED MULTIX COIL ARRAY FOR PARALLEL HIGH FIELD MRI

(75) Inventor: Christoph Leussler, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 201 days.

(21) Appl. No.: 12/293,555

(22) PCT Filed: Mar. 8, 2007

(86) PCT No.: PCT/US2007/063531
§ 371 (c)(1),
(2), (4) Date: Sep. 19, 2008

(87) PCT Pub. No.: WO2007/109426
PCT Pub. Date: Sep. 27, 2007

(65) Prior Publication Data
US 2010/0164492 A1    Jul. 1, 2010

Related U.S. Application Data

(60) Provisional application No. 60/784,829, filed on Mar. 22, 2006.

(51) Int. Cl.
*G01V 3/00* (2006.01)
(52) U.S. Cl. ........................................ 324/318; 324/309
(58) Field of Classification Search .......... 324/300–322; 600/407–445; 335/309; 333/219; 330/130
See application file for complete search history.

(56) References Cited

U.S. PATENT DOCUMENTS

| | | | | |
|---|---|---|---|---|
| 5,128,615 A * | 7/1992 | Oppelt et al. | ................. | 324/322 |
| 5,132,621 A * | 7/1992 | Kang et al. | .................... | 324/322 |
| 7,432,709 B2 * | 10/2008 | Schulz | ......................... | 324/318 |
| 7,538,552 B2 * | 5/2009 | Leussler | ....................... | 324/318 |
| 7,576,542 B1 * | 8/2009 | Lvovsky | ....................... | 324/318 |
| 2003/0100826 A1 | 5/2003 | Savelainen | | |
| 2003/0155917 A1 | 8/2003 | Young et al. | | |
| 2003/0155918 A1 | 8/2003 | Young et al. | | |
| 2008/0094064 A1 * | 4/2008 | Eberler et al. | ................ | 324/318 |
| 2009/0076377 A1 * | 3/2009 | Findekelee | ................... | 600/422 |
| 2010/0056378 A1 * | 3/2010 | Timinger et al. | ............ | 505/162 |
| 2010/0069738 A1 * | 3/2010 | Timinger | ..................... | 600/410 |

FOREIGN PATENT DOCUMENTS

| | | |
|---|---|---|
| EP | 0151726 A2 | 8/1985 |
| WO | 0167126 A1 | 9/2001 |
| WO | 2004086074 A1 | 10/2004 |
| WO | 2005076029 A1 | 8/2005 |

OTHER PUBLICATIONS

Brock, N. A., et al.; Multiple-Mouse MRI; 2003; MRM; 49:158-167.
Ledden, P. J., et al.; Use of a Transmission Line Resonator as a Volume Phased Array; 2000; Proc. Int'l. Soc. Mag. Reson. Med.; 8:1396.
Qu, P., et al.; A Shielding-based Decoupling Technique for Coil Array Design; 2004; Proc. Int'l. Soc. Mag. Reson. Med.; 11:1605.

* cited by examiner

*Primary Examiner* — Brij B Shrivastav

(57) ABSTRACT

A coil arrangement (32) comprises individual coil segments (38₁, 38₂, ..., 38ₙ) disposed adjacently one another adjacent an examination field (14). At least one radio frequency shield (40) is associated with the coil segments (38₁, 38₂, ..., 38ₙ). The radio frequency shield (40) has a first portion (70), which shields the associated coil segments from adjacent magnetic field and magnetic field gradient generating coils (20, 30), and side elements (72, 74), which shield the coil segments or groups of the segments from each other.

20 Claims, 6 Drawing Sheets

Figure 1:
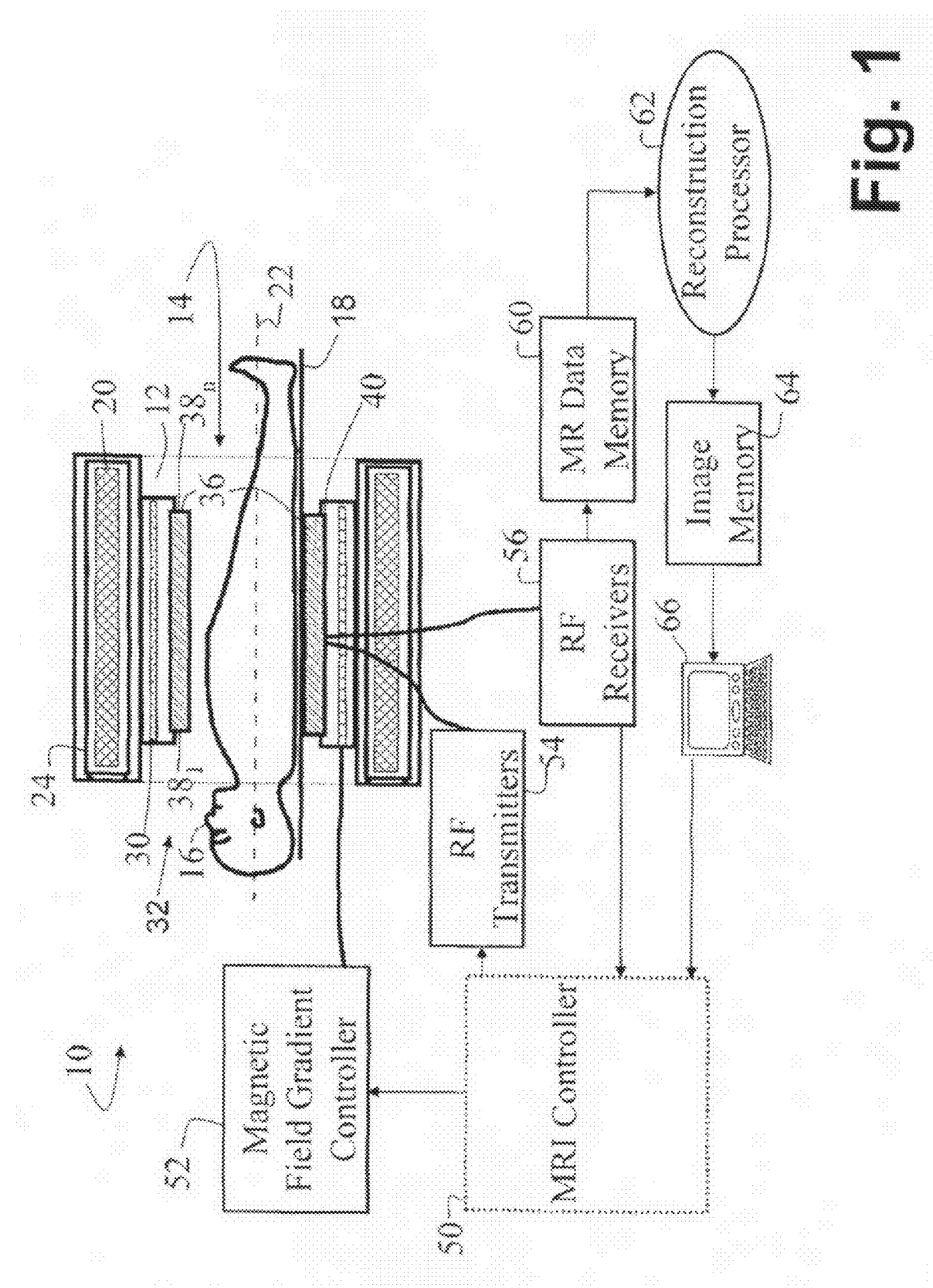

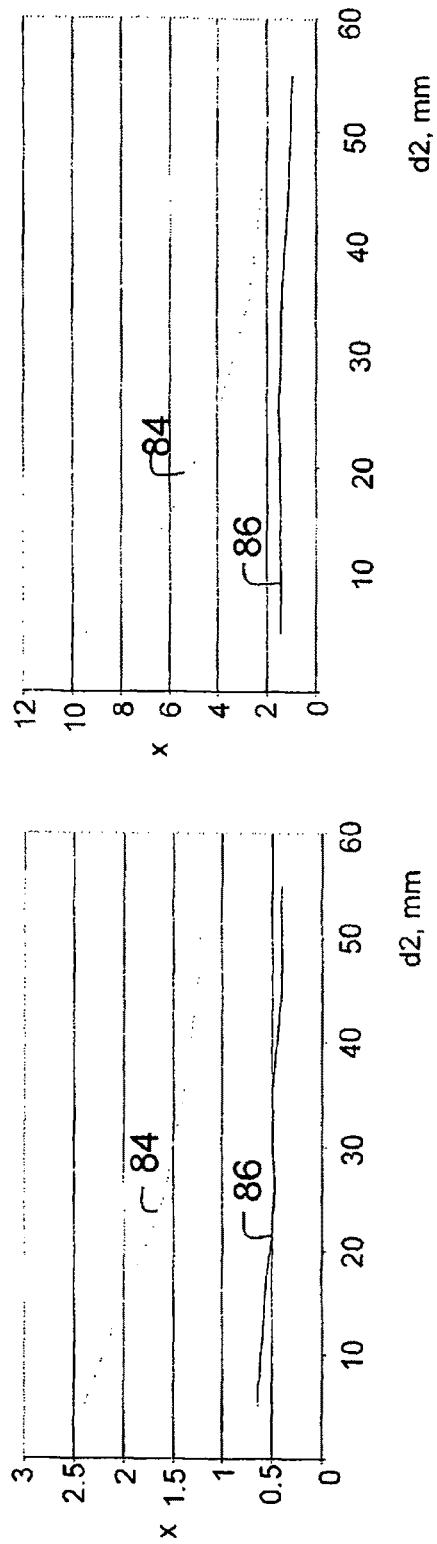
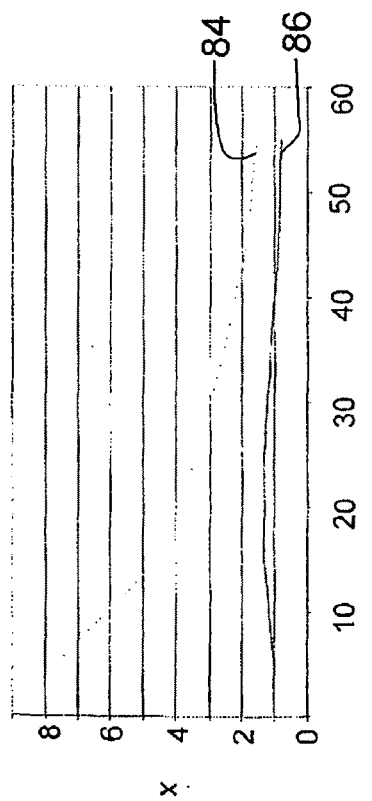
Fig. 4
Fig. 5
Fig. 6

SHIELDED MULTIX COIL ARRAY FOR PARALLEL HIGH FIELD MRI

CROSS REFERENCE TO RELATED APPLICATIONS

This application claims the benefit of U.S. provisional application Ser. No. 60/784,829 filed Mar. 22, 2006, which is incorporated herein by reference.

The following relates to the magnetic resonance arts. It finds particular application in magnetic resonance imaging coils and scanners, and will be described with particular reference thereto. More generally, it finds application in magnetic resonance systems for imaging, spectroscopy, and so forth.

Magnetic resonance imaging (MRI) scanners are commonly used for the examination of patients. In MRI, RF coils are used to generate $B_1$ magnetic fields within the imaging subject for exciting the nuclear spins and detecting signals from the nuclear spins. High frequency body coils (128 MHz) which operate at 3.0T and above, are designed to operate homogenously, and to meet the Specific Absorption Rate (SAR) regulations. The SAR regulations represent the RF dosimetry quantification of the magnitude and distribution of absorbed electromagnetic energy within biological subjects that are exposed to the RF fields.

In some multi-channel transmit/receive MRI systems, each one of a plurality of transmitting units is assigned to each RF coil or coil segment and provided for independently adjusting the amplitude and/or the phase and/or the shape of the RF waveform to be transmitted; while each one of a plurality of receiving units is assigned to each RF coil or coil segment for individually being activated or deactivated. More specifically, independent amplitudes and/or the phases and/or the shapes of the RF waveform to be transmitted are used to compensate for dielectric resonances in examination objects or to excite and optimize desired excitation pattern.

Locating several RF transmitters in close proximal alignment causes mutual coupling between the antenna or coil elements. The phases and amplitudes of the currents in coupled antenna elements become interrelated. Power is exchanged among the individual RF transmit channels. Power absorption from tissue outside the FOV generates RF heating and high, potentially unacceptable, SAR.

One method to compensate for mutual coupling is to use passive decoupling networks. Passive decoupling methods are applicable in a useful manner for a limited number of coils since the determination of the capacitive and/or inductive elements becomes rather difficult for a large number of channels. In addition, a decoupling and matching network is determined and assembled for the expected standard load, which is not necessarily the actual load. At higher fields, small changes in load can have a significant effect on the decoupling of antenna elements. Another problem in the passive decoupling networks includes the presence of parasitic capacitances and inductances of the connectors, which might cause undesired resonances.

The following contemplates improved apparatuses and methods that overcome the aforementioned limitations and others.

According to one aspect, a coil arrangement is disclosed. The coil arrangement comprises individual coil segments disposed adjacently one another adjacent an examination field. At least one radio frequency shield is associated with the coil segments. The radio frequency shield has a first portion, which shields the associated coil segments from adjacent magnetic field and magnetic field gradient generating coils, and side elements, which shield the coil segments or groups of the segments from each other.

According to another aspect, a method of magnetic resonance imaging is disclosed. A substantially spatially and temporally constant magnetic field is generated in an examination region. Selected magnetic field gradients are imposed on the main magnetic field within the examination region. Individual coil segments or groups of coil segments are disposed adjacently one another adjacent the examination region. Each individual or group of coil segments is shielded from adjacent coil segment. A magnetic resonance sequence is conducted including applying RF pulses to and receiving resonance signals with the coil segments.

According to another aspect, a magnetic resonance system is disclosed. A main magnet generates a main magnetic field through an examination region. A plurality of RF coils are disposed adjacent the examination region. At least one RF shield shields the RF coils from the main magnet and from each other.

Numerous additional advantages and benefits will become apparent to those of ordinary skill in the art upon reading the following detailed description.

The following may take form in various components and arrangements of components, and in various process operations and arrangements of process operations. The drawings are only for the purpose of illustrating preferred embodiments and are not to be construed as limiting the application.

Figure 2:
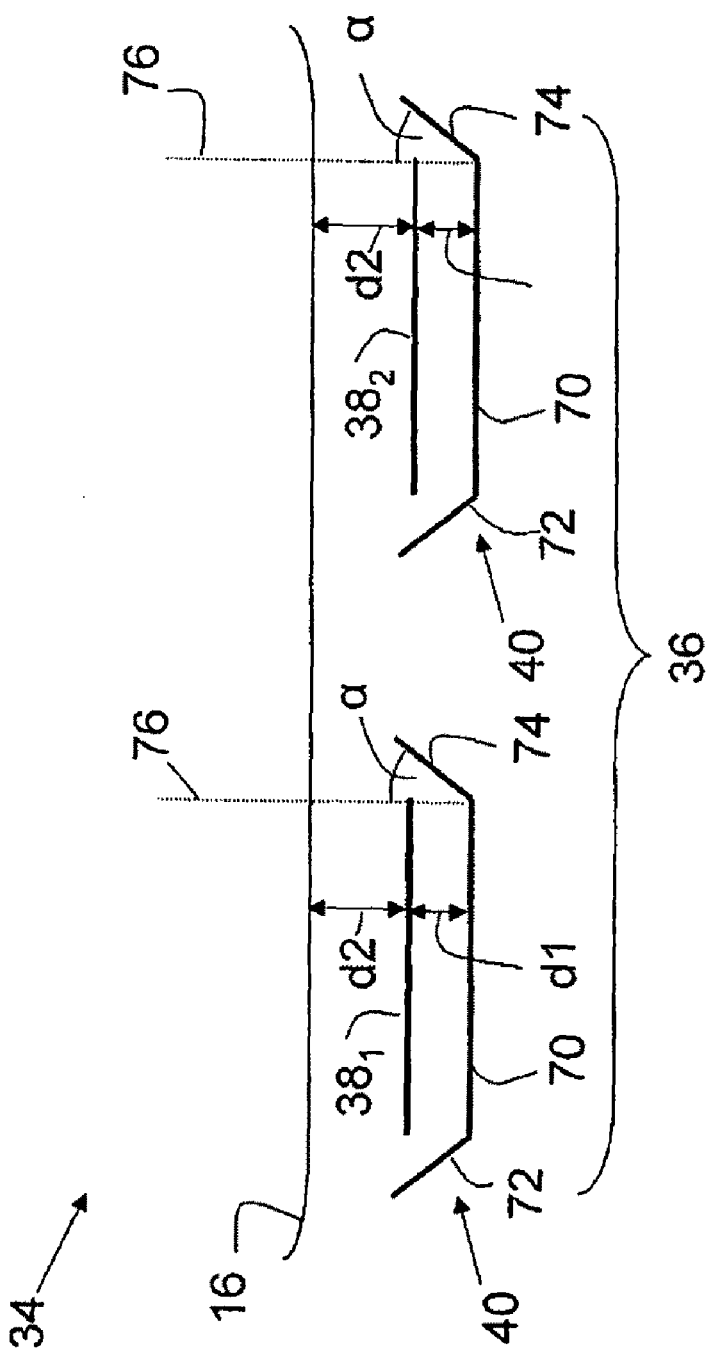
Figure 3:
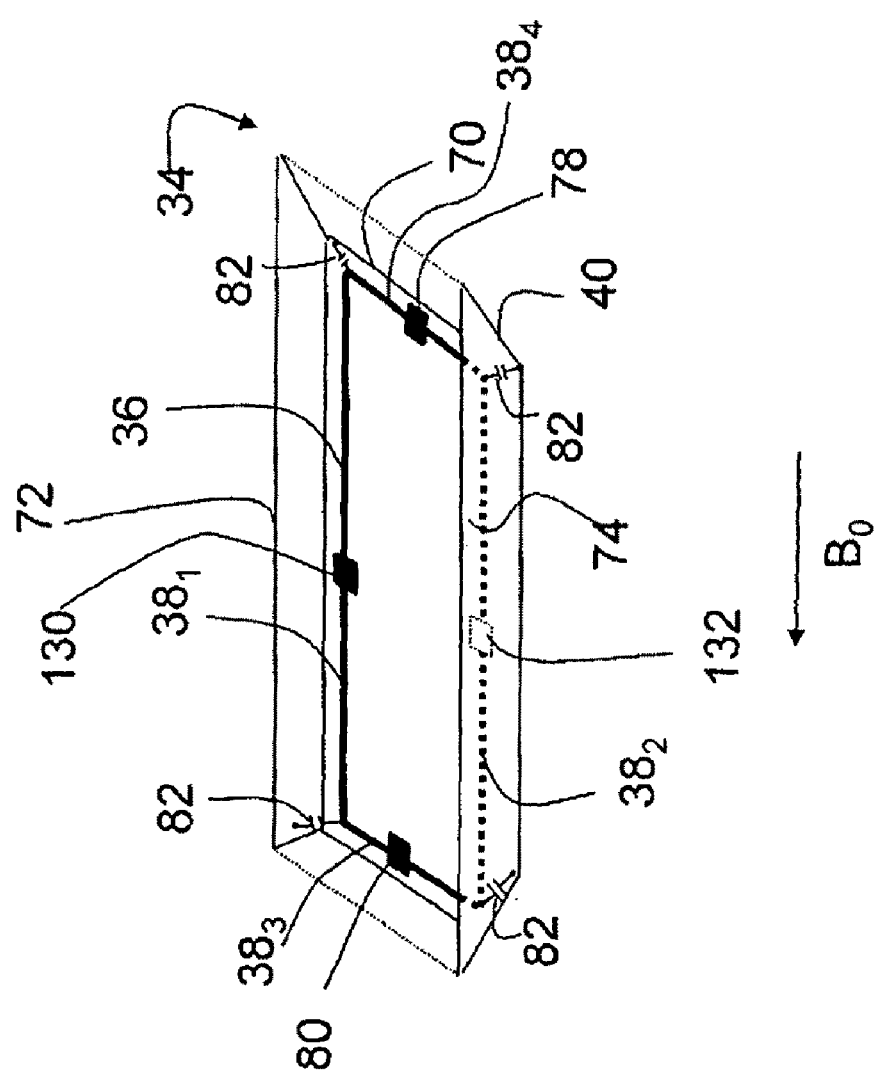
Figure 7:
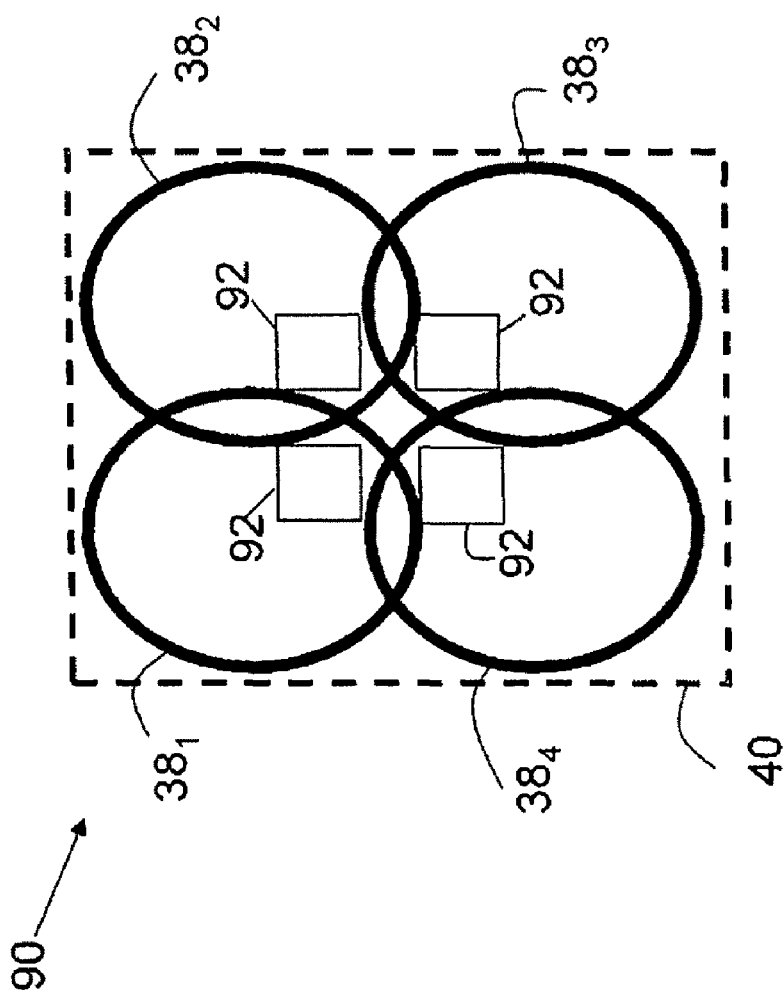
Figure 9:
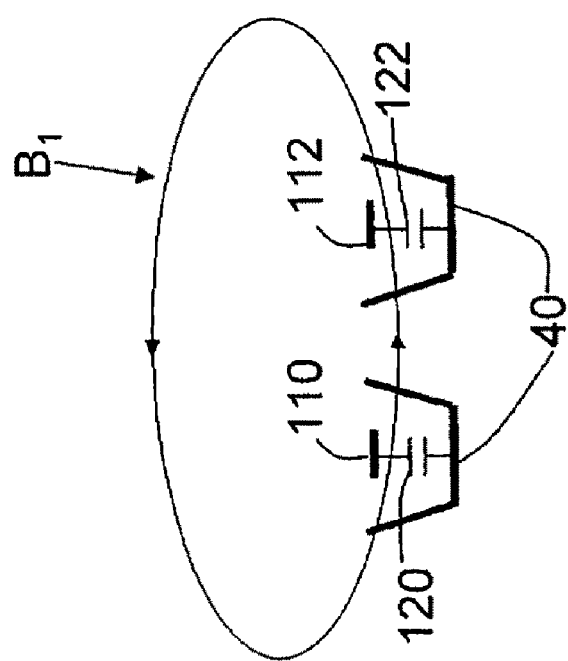
Figure 8:
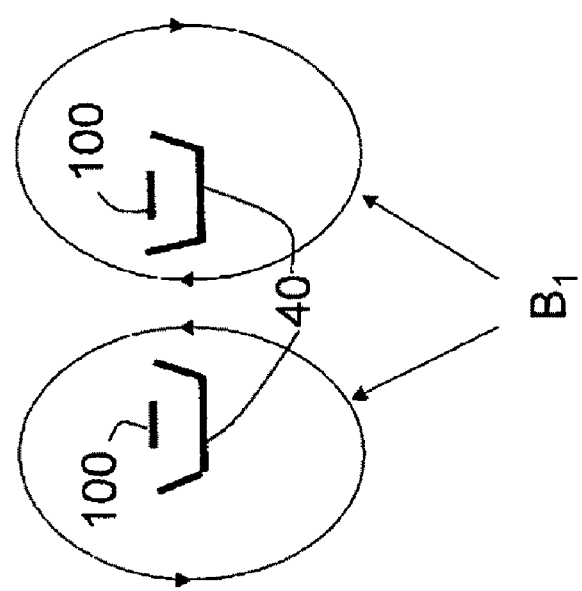

FIG. 1 diagrammatically shows a magnetic resonance imaging system;

FIG. 2 diagrammatically shows adjacent individually shielded coil segments;

FIG. 3 diagrammatically shows a quadrature coil;

FIGS. 4, 5 and 6 are graphs of frequency shift versus the distance from the coil to the subject for different shield configurations (FIGS. 4 and 5) and for different coil/shield spacing at common shield configuration (FIGS. 5 and 6);

FIG. 7 diagrammatically shows a group of coil segments shielded by a common shield;

FIG. 8 diagrammatically shows a coil segment which includes a ring coil; and FIG. 9 diagrammatically shows a coil segment which includes a TEM coil.

With reference to FIGS. 1 and 2, a magnetic resonance imaging system 10 includes a housing 12 defining an examination region 14, in which a patient or other imaging subject 16 is disposed on a patient or subject support or bed 18. A main magnet or magnetic field generating coils 20 disposed in the housing 12 generates a main magnetic field in the examination region 14. Typically, the main magnet 20 is a superconducting magnet surrounded by cryo shrouding 24; however, a resistive or permanent main magnet can also be used. Magnetic field gradient coils 30 are arranged in or on the housing 12 to superimpose selected magnetic field gradients on the main magnetic field within the examination region 14. A radio frequency (RF) coil system or arrangement 32 is disposed adjacent the examination region 14. The coil system 32 includes a plurality of modules 34 including radio frequency coil or resonator 36 made up of one or more elements or segments or rungs $38_1, 38_2, \ldots 38_n$ which each might have a different size and position. A shield 40 shields each individual coil segment $38_1, 38_2, \ldots, 38_n$ or a group of coil segments $38_1, 38_2, \ldots, 38_n$. The coil system 32 may be a TEM coil, an arrangement of loop resonators, or the like. In the exemplary embodiment, the coil system 32 includes a plurality of loop resonators 36 positioned around or in the intended volume of examination. The coil system 32 is, for example, a circularly cylindrical array of longitudinal rungs connected at their ends to form loops, but, of course, might have other geometries, such as planar sections of loop coils above and/or below the subject, flat or arcuate sections of loop coils surrounding the bore, or the like.

With continuing reference to FIG. 1, a magnetic resonance imaging controller 50 operates magnetic field gradient controllers 52 coupled to the gradient coils 30 to superimpose selected magnetic field gradients on the main magnetic field in the examination region 14, and also operates an array of radio frequency transmitters 54 each coupled via an inductive coupling to an individual radio frequency coil segment $38_1$, $38_2$, ..., $38_n$ to inject selected radio frequency excitation pulses at about the magnetic resonance frequency into the examination region 14 for imaging. The inductive coupling eliminates cable waves, thus substantially reducing SAR values and coupling. Of course, it is contemplated that a capacitive coupling can be used. The radio frequency transmitters 54 are individually controlled and can have different phases and amplitudes. The radio frequency excitation pulses excite magnetic resonance signals in the imaging subject 16 that are spatially encoded by the selected magnetic field gradients. Still further, the imaging controller 50 operates radio frequency receivers 56 that each is individually controlled and connected with the individual coil segment $38_1$, $38_2$, ..., $38_n$ of the coil system 32 to demodulate the generated and spatially encoded magnetic resonance signals. The received spatially encoded magnetic resonance data is stored in a magnetic resonance or MR data memory 60.

A reconstruction processor 62 reconstructs the stored magnetic resonance data into a reconstructed image of the imaging subject 16 or a selected portion thereof lying within the examination region 14. The reconstruction processor 62 employs a Fourier transform reconstruction technique or other suitable reconstruction technique that comports with the spatial encoding used in the data acquisition. The reconstructed images are stored in an image memory 64, and can be displayed on a user interface 66, transmitted over a local area network or the Internet, printed by a printer, or otherwise utilized. In the illustrated embodiment, the user interface 66 also enables a radiologist or other user to interface with the imaging controller 50 to select, modify, or execute imaging sequences. In other embodiments, separate user interfaces are provided for operating the scanner 10 and for displaying or otherwise manipulating the reconstructed images.

The described magnetic resonance imaging system 10 is an illustrative example. In general, substantially any magnetic resonance imaging scanner can incorporate the disclosed radio frequency coils. For example, the scanner can be an open magnet scanner, a vertical bore scanner, a low-field scanner, a high-field scanner, or so forth. In the embodiment of FIG. 1, the coil segments $38_1$, $38_2$, ..., $38_n$ of the coil system 32 are used for both transmit and receive phases of the magnetic resonance sequence; however, in other embodiments separate transmit and receive coils may be provided, one or both of which may incorporate one or more of the radio frequency coil designs and design approaches disclosed herein.

With reference again to FIG. 2, each module 34 includes one or more coil segments $38_1$, $38_2$, ..., $38_n$ which define the loop resonator 36 and the individual shield 40 which each is wrapped around an associated module coil segment $38_1$, $38_2$, ..., $38_n$. The individual shields are, for example, connected to one another, galvanically coupled from one coil segment to another, and the like. For the simplicity of the illustration, only two coil segments $38_1$, $38_2$ are shown. Of course, it is contemplated that three, four, five, six and more coil segments are used.

With continuing reference to FIG. 2 and further reference to FIG. 3, the shield 40 includes an RF screen 70 which extends along a side of the coil or segment away from the subject and first and second wings or side shield elements 72, 74 which extend between the two adjacent coil segments $38_1$, $38_2$, ..., $38_n$ (FIG. 2) or coils 36 (FIG. 3). The wings 72, 74 shield each of an associated coil 36 or coil segment $38_1$, $38_2$, ..., $38_n$ from interfering with the magnetic resonance signals of the adjacent coils 36 or coil segments $38_1$, $38_2$, ..., $38_n$ to minimize coupling of the coils 36 or coil segments $38_1$, $38_2$, ..., $38_n$ of the coil system 32 from one another. An angle α between a vertical axis 76, which is substantially orthogonal to a surface of the coil, and a plane drawn through the side shield 72, 74, is selected for each coil segment $38_1$, $38_2$, ..., $38_n$ or a group of the coil segments $38_1$, $38_2$, ..., $38_n$ or coil 36 of the coil arrangement 32. For example, the angle α might be 30, 45, 60 and 90°. For example, the coil segments $38_1$, $38_2$, ..., $38_n$ of a flat cardiac coil arrangement, e.g. a surface coil arrangement, have an outer wing angle α equal to 90° and an inner wing angle α equal to 60°, where the outer wing is the wing distant from the subject 16 and the inner wing is the wing proximate to the subject 16. Generally, a greater spacing between the wing and the coil segment, e.g. a greater angle α, results in a greater reduction of the stray magnetic field. The size of the wings 72, 74 might differ from application to application. E.g., for the cardiac coil arrangement of the example above, the outer wing can be of a longer length than the inner wing for a better subject comfort. A shape of the wing is selected accordingly to the application. For example, the wing can be a circular segment. In one embodiment, for frequencies under 3T, the screen 70 is omitted.

With continuing reference to FIG. 2, the shield screen 70 is positioned at a first distance d1 from the coil segments $38_1$, $38_2$. The subject 16 is positioned at a second distance d2 from the coil segments $38_1$, $38_2$. The distance d2 of the coil segment $38_1$, $38_2$, ..., $38_n$ to the subject 16 can be, for example, adjusted by a use of a foam mattress. Positioning the coil segment $38_1$, $38_2$, ..., $38_n$ too close to the shield screen 70 results in poor loading of the coil. The optimal distance between the coil and shield screen can be determined by calculating a ratio x between a loaded and unloaded coil:

$$x = \frac{Q_{unloaded}}{Q_{loaded}}$$

For the distance d2 between the subject and the coil equal to about 2 cm, the ratio x is expected to be equal to about 4. A lower value of the ratio x indicates lower coupling of the RF electromagnetic $B_1$ field to the subject 16, while a higher value of the ratio x results in higher power absorption in the tissue load. Optimal distance is achieved when electromagnetic RF power loss of the coil is small compared to losses of the loading tissue.

With reference again to FIG. 3, in a quadrature embodiment, reactive elements 78, 80 are disposed at traverse coil segments $38_3$, $38_4$, which connect longitudinal coil segments $38_1$, $38_2$ extending parallel to the main magnetic $B_0$ field, to control current flow in a loop mode. Additional reactive elements 82 are disposed between the ends of the longitudinal segments $38_1$, $38_2$ and the shield 40 to control current flow in a TEM mode. The reactive elements can be selected to balance the loop and TEM modes for balanced quadrature operation or to weight the loop and TEM modes as desired.

With reference again to FIG. 2 and further reference to FIG. 4, an upper graph 84 shows a change in the ratio x and a lower graph 86 shows a frequency in MHz shift as a function of the distance d2 from the coil segment $38_1, 38_2, \ldots, 38_n$ to the subject 16. The distance d1 from the shield screen 70 to the coil segment $38_1, 38_2, \ldots, 38_n$ is equal to 10 mm, and the angle α is equal to 0°.

With reference to FIG. 5, the similar graphs 84, 86 are illustrated. The distance d1 from the shield screen 70 to the coil segment $38_1, 38_2, \ldots, 38_n$ is equal to 10 mm, and the angle α is equal to 90°.

With reference to FIG. 6, the similar graphs 84, 86 are illustrated. The distance d1 from the shield screen 70 to the coil segment $38_1, 38_2, \ldots, 38_n$ is equal to 15 mm, and the angle α is equal to 90°. As seen in the graphs of FIGS. 4, 5 and 6, an increase in the distance d1 from the shield screen 70 to the coil segment $38_1, 38_2, \ldots, 38_n$ results in an increased ratio x; while using the shield wings at a 90° angle results in more uniform magnetic field.

In one embodiment, for 3T imaging, the distance d1 between the shield screen 70 and the coil segment $38_1, 38_2, \ldots, 38_n$ is equal to about 2 cm and the distance d2 between the coil segment $38_1, 38_2, \ldots, 38_n$ and the subject 16 is equal to about 2 cm. In another embodiment, for 7T imaging, the distance d1 between the shield screen 70 and the coil segment $38_1, 38_2, \ldots, 38_n$ is equal to about 50 mm and the distance d2 between the coil segment $38_1, 38_2, \ldots, 38_n$ and the subject 16 is equal to about 3 cm.

With reference to FIG. 7, a coil group 90 includes the coils segments $38_1, 38_2, \ldots, 38_n$. The coil segments $38_1, 38_2, \ldots, 38_n$ of the coil group 90 are shielded by a common shield 40 which has wings raised at the edges, that are adjacent other coils, to the height of the segments or beyond. Of course, it is contemplated that the coil group 90 may include a different number of coil segments such as, for example, two coil segments.

In one embodiment, the shield 70 includes a large screen wrapped around all of the coil segments $38_1, 38_2, \ldots, 38_n$ or the group of the coil segments $38_1, 38_2, \ldots, 38_n$. The wings 72, 74 are projected from between the adjacent coil segments $38_1, 38_2, \ldots, 38_n$. In one embodiment, the shield wings are connected to the large screen.

In one embodiment, each individual coil element $38_1, 38_2, \ldots, 38_n$ includes an associated electronics or an electronics module 92. For example, each individual coil element includes an integrated send/receive switch and/or preamplifier.

With reference to FIG. 8, the coil segments $38_1, 38_2, \ldots, 38_n$ define a ring coil including a loop 100 which is wrapped by the shield 40.

With reference to FIG. 9, the coil segments $38_1, 38_2, \ldots, 38_n$ define a TEM coil. The segments include two rods 110, 112. The shield 40 is used as a current return path and is coupled to the rods 110, 112 by capacitances 120, 122. In one embodiment, each rod is connected to the shield 40 by a pair of capacitances, one at each end of the rod. Of course a larger plurality of rods, e.g. rod surrounding the subject, is contemplated. Such coil arrangement generates a loop current, e.g. the coil arrangement can be used in the ring mode and in the TEM mode for the quadrature applications.

With reference again to FIG. 3, in one embodiment, a diode network 130, 132 is used to connect/disconnect one or more shields 70 or parts of the shield 70 to change the magnetic $B_1$ field within the examination region 14, e.g. to increase the sensitivity of the magnetic $B_1$ field and, accordingly, increase the signal to noise ratio. E.g., by using more shielding, the lower magnetic field is obtained; by using less shielding, the higher magnetic field can be obtained. While an extended shielding and high mutual decoupling is required during transmit, the situation during reception is different as the coils are further decoupled by high impedance preamplifiers.

In one embodiment, the individual coil elements are used close to the shield screen as an integrated body coil. The coil segments can be used as individual building blocks for total Multix body coil where a high number of z/xy segmentation is required. The shield wings extend between the adjacent coil elements. In another embodiment, the shielded coil elements are integrated in the patient bed 18, or in the scanner mechanical housing for body/spine imaging. In another embodiment, the shielded coil elements are used in combination with an integrated large Multix body coil.

In one embodiment, each shielded individual coil element is driven with a hardware combiner which distribute an individual amplitude and phase to one or several coil segments. In another embodiment, each coil segment is driven with a Multix spectrometer to provide an individual pulse shape for each coil segment. In another embodiment, each coil segment includes a pulse shaper to provide an individual pulse shape.

In this manner, a new shielded coil technology for individual coil segment results in a substantial reduction in mutual next neighbor coil coupling and a substantial reduction of coil loading of surrounding tissue, thus reducing SAR and RF values power requirements. Decoupling networks can be neglected, thus improving flexibility and ease of use for clinical application. The individual shield is designed so that it enfolds partly the planar conductor of the coil which provides focusing of the magnetic $B_1$ field in the field of view. When the shield is used as a current return path, a further orthogonal mode can be used for quadrature, multi-resonant or improved multi-element transmit coil architecture. The shield is numerically designed for minimal coupling and lowest stray field.

The above has been described with reference to the preferred embodiments. Obviously, modifications and alterations will occur to others upon reading and understanding the preceding detailed description. It is intended that the application be construed as including all such modifications and alterations insofar as they come within the scope of the appended claims or the equivalents thereof.

The invention claimed is:

1. A coil arrangement comprising:
   individual coil segments disposed adjacently one another adjacent an examination field; and
   at least one radio frequency shield associated with the coil segments, which radio frequency shield has a first portion, which shields the associated coil segments from adjacent magnetic field and magnetic field gradient generating coils, and side elements, which shield the coil segments or groups of the coil segments from each other.

2. The coil arrangement as set forth in claim 1, wherein the side elements extend between the coil segments.

3. The coil arrangement as set forth in claim 2, wherein the side elements are tilted away from each associated coil segment.

4. The coil arrangement as set forth in claim 2, wherein the radio frequency shield first portion further includes:
   a radio frequency screen which wraps peripherally around a bore defined by the magnetic field coils and the gradient coils.

5. The coil arrangement as set forth in claim 4, wherein the side elements are electrically connected to the radio frequency screen.

6. The coil arrangement as set forth in claim 1, further including:
an electronics module electrically connected with one or a group of the coil segments.

7. The coil arrangement as set forth in claim 6, wherein the electronics module includes at least one of:
a pre-amplifier, and
a send/receive switch.

8. The coil arrangement as set forth in claim 1, wherein the coil segments include:
a plurality of longitudinal coil segments extending parallel to a main magnetic field; and
a plurality of segments extending circumferentially between ends of the longitudinal segments to define a plurality of loop coils, the shield side elements extending shielding loop coils or groups of loop coils from each other.

9. The coil arrangement as set forth in claim 8, further including:
reactive elements defined in the circumferential coil segments and connecting ends of the longitudinal coil segments with the shield to define a loop coil and TEM resonators for quadrature transmission or reception.

10. The coil arrangement as set forth in claim 8, wherein each shield shields one associated loop coil.

11. The coil arrangement as set forth in claim 8, further including:
a switch which selectively at least one of connects, disconnects and opens individual shield portions to selectively change magnetic field sensitivity.

12. The coil arrangement as set forth in claim 1, further including:
a plurality of RF transmitters, each connected with one or a group of coil segments which selectively injects individually designed RF excitation pulses into the examination region; and
a plurality of RF receivers which demodulates and converts MR signals received by one or a group of segments.

13. A magnetic resonance imaging system comprising:
a main magnet generating a substantially temporally constant magnetic field in the examination region;
magnetic field gradient coils that impose selected magnetic field gradients on the main magnetic field within the examination region; and
the coil arrangement as set forth in claim 1.

14. A magnetic resonance method comprising:
generating a substantially spatially and temporally constant magnetic field in an examination region;
imposing selected magnetic field gradients on the main magnetic field within the examination region;
disposing individual coil segments or groups of coil segments adjacently one another adjacent the examination region;
shielding each individual or group of coil segments from adjacent coil segment; and
conducting a magnetic resonance sequence including applying RF pulses to and receiving resonance signals with the coil segments.

15. A magnetic resonance system comprising:
a main magnet which generates a main magnetic field through an examination region;
a plurality of RF coils disposed adjacent the examination region; and
at least one RF shield which shields the RF coils from the main magnet and from each other.

16. The magnetic resonance system as set forth in claim 15, wherein the RF shield includes:
at least one RF screen portion disposed between the RF coils and the main magnet and side sections extending between adjacent RF coils.

17. The magnetic resonance system as set forth in claim 16, wherein each RF coil includes one or more loop coils.

18. The magnetic resonance system as set forth in claim 16, wherein each RF coil includes:
a longitudinal segment extending parallel to the main magnetic field and reactively coupled to the shield to define a TEM resonator, the shield side sections being disposed between adjacent longitudinal segments.

19. The magnetic resonance system as set forth in claim 16, wherein each RF coil includes:
a pair of longitudinal segments extending parallel to the main magnetic field;
a pair of transverse segments connecting ends of the pair of longitudinal segments to define a loop coil; and
reactive elements connecting ends of the longitudinal segments with the shield to define a pair of TEM resonators, whereby the loop coil and the TEM resonators define a quadrature coil.

20. The magnetic resonance system as set forth in claim 16, wherein the plurality of RF coils are arranged in one of:
a planar array; and
circumferentially around the examination region.

* * * * *